(12) United States Patent
Herrera

(10) Patent No.: US 7,907,012 B2
(45) Date of Patent: Mar. 15, 2011

(54) CURRENT MIRROR WITH LOW HEADROOM AND LINEAR RESPONSE

(75) Inventor: Sandro Herrera, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 7 days.

(21) Appl. No.: 12/255,326

(22) Filed: Oct. 21, 2008

(65) Prior Publication Data
US 2010/0097141 A1   Apr. 22, 2010

(51) Int. Cl.
H03F 3/45 (2006.01)
(52) U.S. Cl. .................................. 330/257; 330/288
(58) Field of Classification Search .................. 330/257, 330/288; 323/315, 316
See application file for complete search history.

(56) References Cited

U.S. PATENT DOCUMENTS

| | | | |
|---|---|---|---|
| 6,515,546 B2 * | 2/2003 | Liwinski | 330/296 |
| 6,753,734 B2 * | 6/2004 | Arell et al. | 330/296 |
| 6,842,075 B2 * | 1/2005 | Johnson et al. | 330/296 |

OTHER PUBLICATIONS

David Johns et al., Analog Integrated Circuit Design, (1997), pp. 125-180, 256-303, published by J. Wiley & Sons, Inc., U.S. and Canada.

* cited by examiner

*Primary Examiner* — Henry K Choe
(74) *Attorney, Agent, or Firm* — Kenyon & Kenyon LLP

(57) ABSTRACT

A current mirror circuit provided in an emitter follower configuration achieves linear output currents over a range of input currents by operating in response to a bias current that is a replica of the input current. The current mirror may include a pair of transistors and a pair of resistors, in which: a first resistor and a base of a first transistor are coupled to a first input terminal for a first input current, an emitter of the first transistor and a base of the second transistor are coupled to a second input terminal for a second input current, the first and second input currents being replicas of each other, an emitter of the second transistor being coupled to the second resistor, a collector of the second transistor being coupled to an output terminal of the current mirror, and a collector of the first transistor and the two resistors are coupled to a common node.

15 Claims, 6 Drawing Sheets

600

800

CURRENT MIRROR WITH LOW HEADROOM AND LINEAR RESPONSE

BACKGROUND

The present invention relates to a current mirror circuit that provides linear output with low headroom requirements.

Current mirrors are well known but they suffer from known disadvantages. Two basic current mirrors are shown in FIGS. 1 and 2. The current mirror of FIG. 1 is called a diode current mirror. It includes a pair of transistors Q1 and Q2 in which the input transistor Q1 is connected as a diode. The base and collector of Q1 are connected to the base of Q2. The input current signal is fed at an input node $N_{1.1}$ which creates an input potential drop of $V_{1.1} = V_{BE1} + V_{RE1}$. The base-to-emitter voltages of each transistor Q1, Q2 ($V_{BE1}$ and $V_{BE2}$) vary together with the input current signal; thus, $V_{BE}$ non-linearities tend to cancel out. The input current $I_{IN}$ generates a corresponding output current $I_{OUT}$ at the same level. Although the diode current mirror provides an output current that has a linear response to a changing input current ($I_{IN} = I_{IN}(t)$), it imposes an input headroom requirement of $V_{BE1} + V_{RE1}$. In practice, this can be as high as 1V.

The current mirror of FIG. 2 is called an emitter follower mirror. The circuit also includes a pair of transistors Q1, Q2. This circuit requires a bias current ($I_{BIAS}$) provided at node $N_{2.2}$. The input current $I_{IN}$ is fed directly to the resistor RE1, creating a voltage at the input terminal of $V_{2.1} = I_{IN}*R$ (assume RE1=RE2=R). At node $N_{2.2}$, the input and bias currents create a voltage $V_{2.2} = V_{IN} + V_{BE1}$. At the emitter of Q2, the current mirror generates a voltage $V_{2.3} = V_{IN} + V_{BE1} - V_{BE2}$, which results in an output current of $I_{OUT} = V_{2.3}/R = 1/R*(I_{IN}*R + V_{BE1} - V_{BE2})$ if base current errors are ignored. In all known emitter follower mirrors, the bias current $I_{BIAS}$ is provided as a constant current.

The emitter follower mirror possesses a disadvantage because $I_{OUT}$ varies non-linearly with $I_{IN}$. The input current to the mirror $I_{IN}$ is a time varying signal ($I_{IN} = I_{IN}(t)$), which causes $V_{BE2}$ to vary over time ($V_{BE2} = V_{BE2}(t)$). $V_{BE1}$ does not vary, due to the constant bias current $I_{BIAS}$. This configuration generates an output current as follows:

$$I_{OUT} = V_{2.3}/R = 1/R*(I_{IN}*R + V_{BE1} - V_{BE2}(t))$$

Although the $V_{BE1} - V_{BE2}$ term in $I_{OUT}$ ideally would cancel out, it does not over most conditions. This leads to the non-linear response of the emitter follower mirror.

By way of example, consider a use case in which the input current $I_{IN}$ doubles over time. The voltage at node $N_{2.1}$ will double, and the voltage across RE2 will roughly double. As a result, the output current will roughly double which causes a change in $V_{BE2}$ of about 18 mv. Since $I_{BIAS}$ does not change, $V_{BE1}$ will not change. This behavior would induce an error in the output current $I_{OUT}$ of about 18 mv/RE2=18 mV/R.

There is no known current mirror circuit that provides a linear output while requiring low input headroom requirements for the input current signal.

DETAILED DESCRIPTION

The disadvantages of the prior art are overcome by a current mirror circuit that provides a low headroom input requirement and provides a linear output current. The current mirror is configured as an emitter follower mirror that accepts a first input current signal $I_{IN}(t)$ at an input and also receives a replica of $I_{IN}(t)$ used as a bias current. The replica bias current provides a linear output response of the proposed current mirror.

Figure 3:
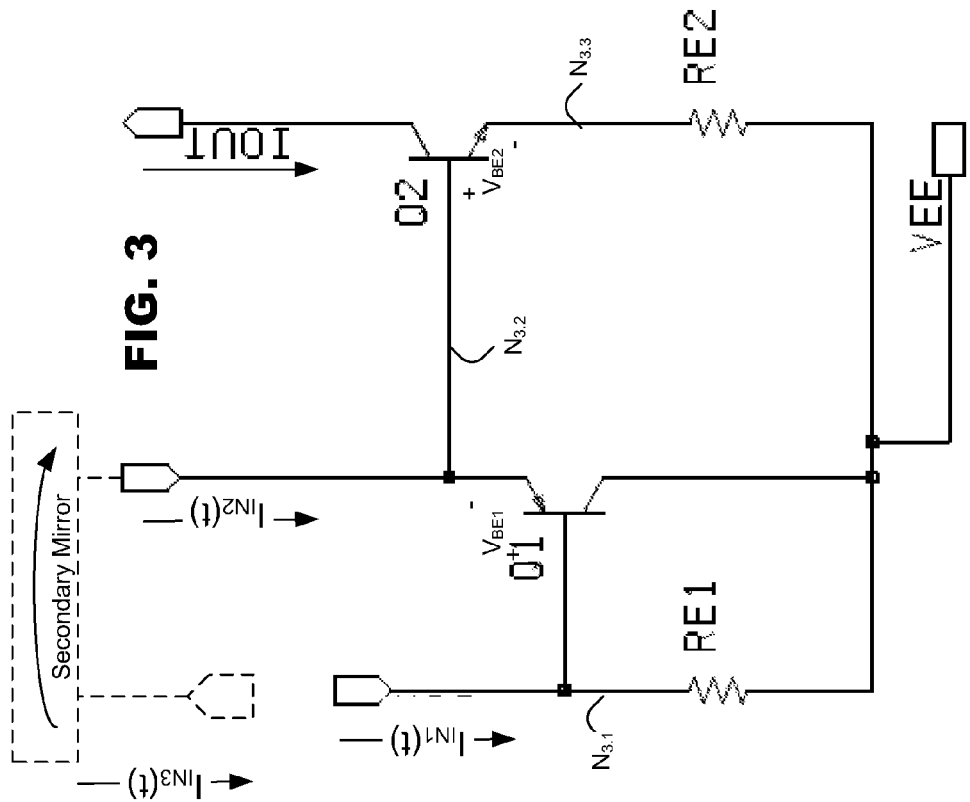
FIG. 3 is a circuit diagram of a current mirror according to an embodiment of the present invention.

FIG. 3 is a circuit diagram of a current mirror 300 according to an embodiment of the present invention. The current mirror 300 may include a pair of transistors Q1, Q2 and a pair of resistors RE1, RE2. A first transistor Q1 is coupled to an input current source $I_{IN1}(t)$ at its base which also is connected to the first resistor RE1. An emitter of the first transistor Q1 may be coupled to a replica of the input current $I_{IN2}(t)$.

A base of the second transistor Q2 also may be connected to the replica input current $I_{IN2}(t)$. An emitter of the second transistor Q2 may be coupled to the second resistor RE2. A collector of the second transistor Q2 may be coupled to an output terminal of the current mirror. The first and second resistors RE1, RE2 and a collector of the first transistor Q1 may be connected to a common node, commonly ground or a power rail.

Figure 2:
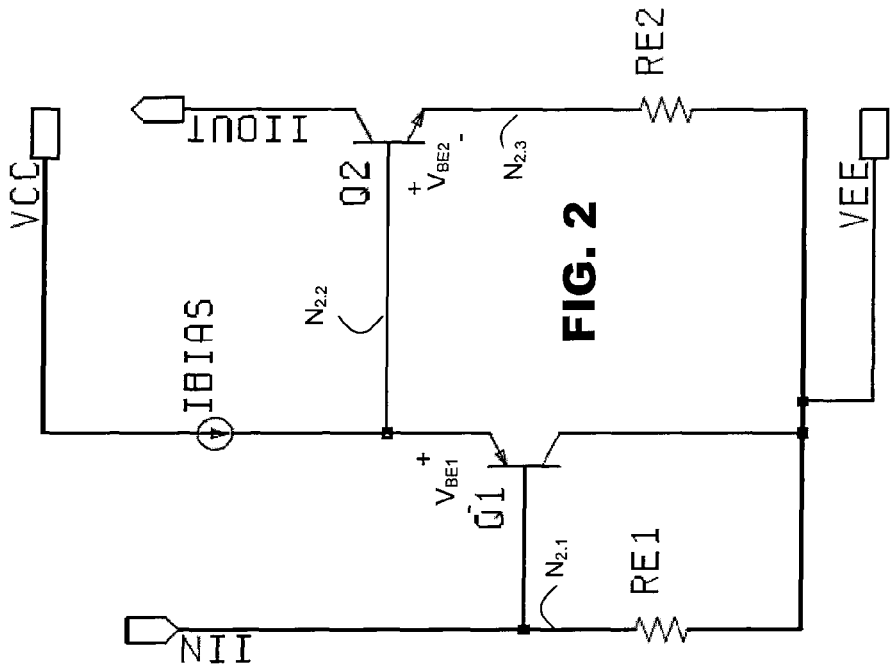
FIG. 2 is a circuit diagram of another known current mirror.
Figure 1:
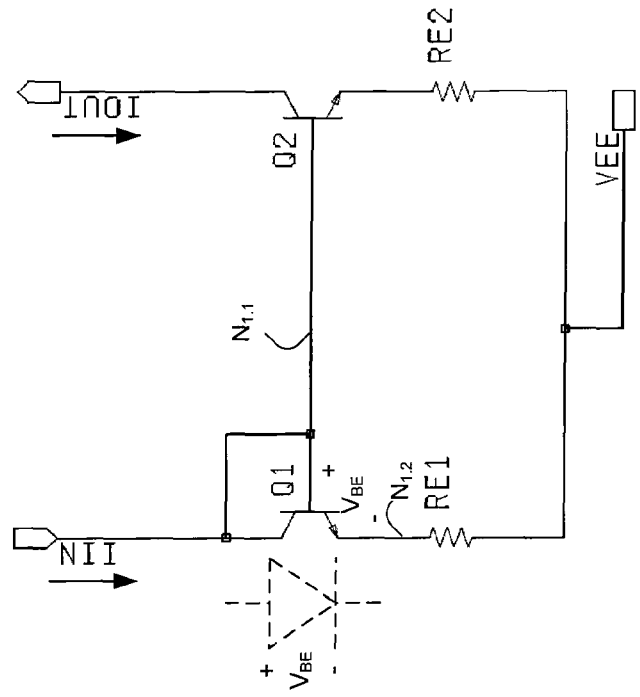
FIG. 1 is a circuit diagram of a known current mirror.

The current mirror 300 of FIG. 3 uses the replica input current $I_{IN2}(t)$ as a bias current to the first transistor Q1. During operation, the input current $I_{IN1}(t)$ generates a voltage at node $N_{3.1}$ as $V_{3.3} = I_{IN1}(t)*RE1$. The input headroom limitation is the voltage drop across resistor RE1 which is much lower than the limitations incurred by the current mirror of FIG. 1. The voltage at node $N_{3.2}$ is $I_{IN1}(t)*RE1 + V_{BE1}$. Finally, the voltage at node $N_{3.3}$ is $I_{IN1}(t)*RE1 + V_{BE1} - V_{BE2}$. Because the bias current $I_{IN2}(t)$ to this circuit is a replica of the input current $I_{IN1}(t)$, the base-to-emitter voltages of transistors Q1 and Q2 will be equal and will vary together, therefore, cancel each other. Thus, the current mirror achieves linear operation.

The circuit of FIG. 3 finds application in complementary circuits in which it is common to generate input current pairs, in which one current comes from a source and a complementary current comes from a sink. To accommodate this circuit in such designs, the circuit also may include a secondary mirror that is responsive to a sinking input current $I_{IN3}(t)$, which is equal in magnitude to $I_{IN1}(t)$, in this case a sourcing input current. This secondary mirror generates an output current in the same direction as $I_{IN1}(t)$. Thus, in this embodiment, current $I_{IN3}(t)$ generates a second current, $I_{IN2}(t)$, which is equal to and in the same direction as $I_{IN1}(t)$. The second current $I_{IN2}(t)$ may be input to the primary current mirror of FIG. 3 as a bias current to Q1.

Figure 4:
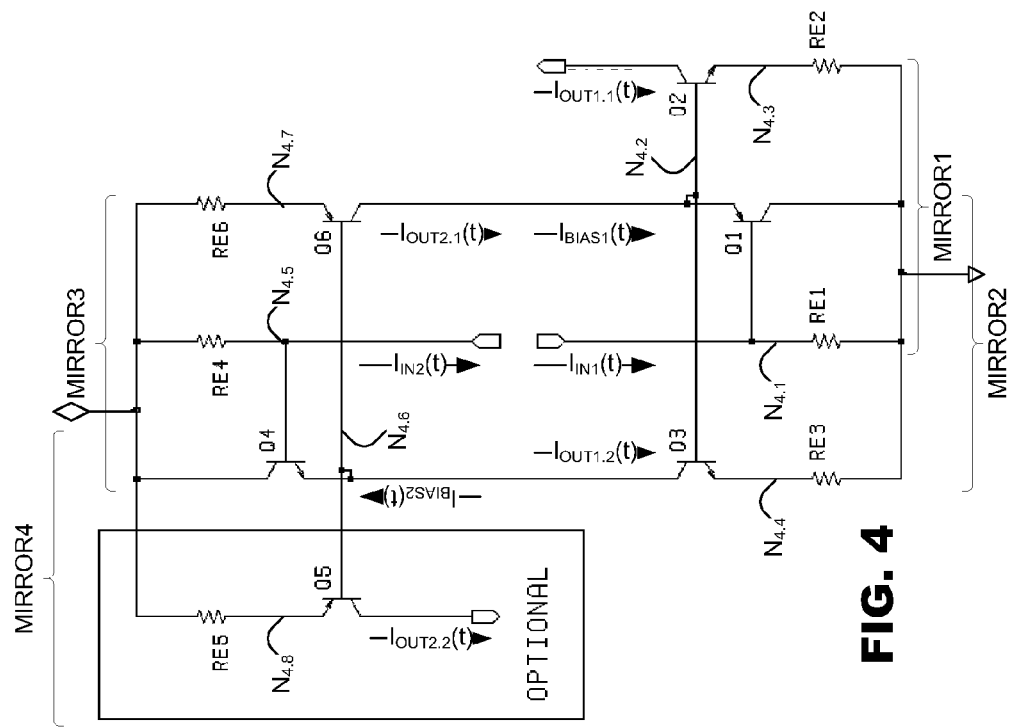
FIG. 4 is a circuit diagram of another current mirror according to an embodiment of the present invention.

FIG. 4 illustrates a current mirror system according to another embodiment of the present invention. This embodiment finds application in a complementary system where complementary input currents $I_{IN}1(t)$ and $I_{IN}2(t)$ are available. The circuit may include three or, optionally, four copies of the current mirror of FIG. 3.

A first mirror, shown as mirror 1, may include a first pair of transistors Q1, Q2 and a first pair of resistors RE1, RE2 configured as described in FIG. 3. Input current $I_{IN1}(t)$ is the input to the mirror. A bias current $I_{BIAS1}(t)$ is input to the mirror at node $N_{4.2}$. Mirror 1 may generate an output current $I_{OUT1.1}(t)$.

A second mirror, shown as mirror 2, may include a pair of transistors Q1, Q3 and a pair of resistors RE1, RE3. Transistor Q1 and resistor RE1 are shared among mirrors 1 and 2. Mirror 2 accepts an input current $I_{IN1}(t)$ and a bias current $I_{BIAS1}(t)$, which are shared among mirrors 1 and 2. Mirror 2 may generate an output current $I_{OUT1.2}(t)$.

A third mirror, shown as mirror 3, may include a pair of transistor Q4 and Q6 and a pair of resistors RE4, RE6. Input current $I_{IN2}(t)$ is input to the mirror, which is sink version of $I_{IN1}(t)$. A bias current $I_{BIAS2}(t)$ may be input to the mirror at node $N_{4.6}$. Mirror 3 may generate an output current $I_{OUT2.2}(t)$.

A fourth mirror, which is optional, may include transistors Q4, Q5 and resistors RE4, RE5. Transistor Q4 and resistor RE4 may be shared among mirrors 3 and 4. Input current $I_{IN2}(t)$ and bias current $I_{BIAS2}(t)$ are shared among mirrors 3 and 4. Mirror 4 may generate an output current $I_{OUT2.2}(t)$.

In the circuit of FIG. 4, mirror 1 may receive an output current from mirror 3 as a bias current ($I_{OUT2.1}(t)$ becomes $I_{BIAS1}(t)$). This maintains linear operation on mirror 1, ensuring $I_{OUT1.1}(t)=I_{IN1}(t)$. The response of mirror 3 will be kept linear if mirror 3 receives a bias current which also matches the input current. Mirror 3 receives an output current from mirror 2 as a bias current ($I_{OUT1.2}(t)$ becomes $I_{BIAS2}(t)$). This maintains linear operation on mirror 3, ensuring $I_{OUT2.1}(t) = I_{IN2}(t)$. Thus, mirrors 2 and 3 keep each other in balance. They receive the output currents of their counterpart mirror as bias currents and, since these are equal to the input current, a linear response is ensured over the mirror system 400 as a whole.

Figure 5:
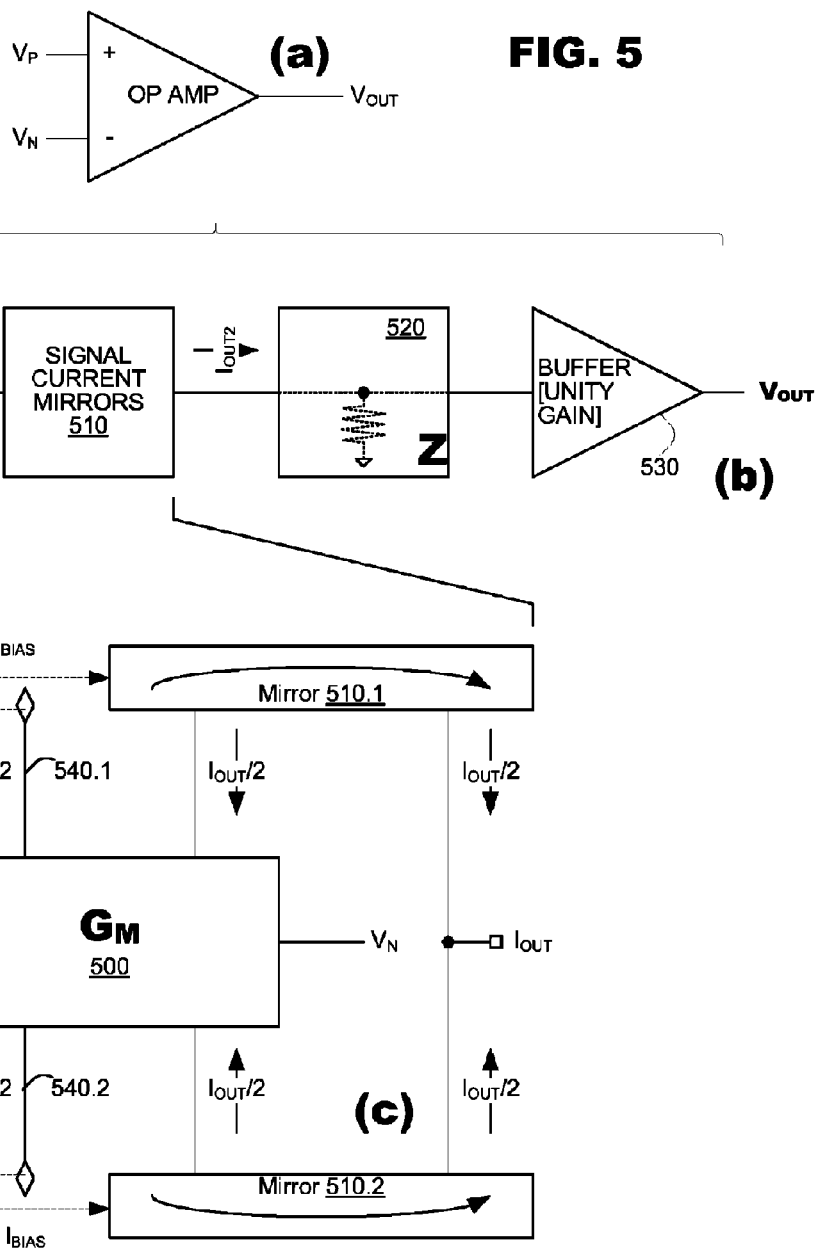
FIG. 5 is a diagram of an operational amplifier according to an embodiment of the present invention.

The current mirror of FIG. 3 finds application in a variety of circuit systems. FIG. 5 illustrates application of the current mirror in an operational amplifier (op amp), according to an embodiment of the present invention. FIG. 5(*a*) illustrates an op amp symbolically. An op amp is a known circuit that generates an output voltage based on a difference between two input voltages $V_P$, $V_N$ as $V_{OUT}=A*(V_P-V_N)$, where A is a gain factor provided by the op amp.

FIG. 5(*b*) provides a block diagram for a single stage operational amplifier. In this model, a transconductance cell $G_M$ 500 generates a current $I_{OUT1}$ in response to a difference between the input voltages ($I_{OUT1}=G_M*(V_P-V_N)$). Signal current mirrors 510 generate an output current $I_{OUT2}$ corresponding to the current received from the transconductance cell $G_M$ 500. The $I_{OUT2}$ current is passed through a large impedance Z, which creates a voltage $G_M*Z*(V_P-V_N)$. Another amplifier buffer 530 is shown (with a gain of 1) which generates the output voltage $V_{OUT}=G_M*Z*(V_P-V_N)$, where the op amp gain $A=G_M*Z$.

FIG. 5(*c*) illustrates application of the current mirror to an op amp input stage. A complementary transconductance cell $G_M$500 generates currents in response to a difference among inputs $V_P$ and $V_N$. These transconductance stages 500 are well known; typically, they generate two pairs of differential output currents each having magnitude $I_{OUT}/2$. A pair of the current mirrors shown in FIG. 3 can be used as mirrors 510.1, 510.2. In response to the respective currents $I_{OUT}/2$, the current mirrors 510.1, 510.2 may generate corresponding currents $I_{OUT}/2$ on their outputs, which are summed at an output node to generate $I_{OUT}$. The output current $I_{OUT}$ of FIG. 5(*c*) can be used as current $I_{OUT2}$ of FIG. 5(*b*).

The second current pair 540.1, 540.2 from the transconductance stage 500 can be shunted to the supply rails of the system (not shown). Alternatively, the second current pair 540.1, 540.2 may be conveyed respectively to the current mirrors 510.1, 510.2 as sources for the bias current (shown as $I_{BIAS}$, in phantom).

Figure 6:
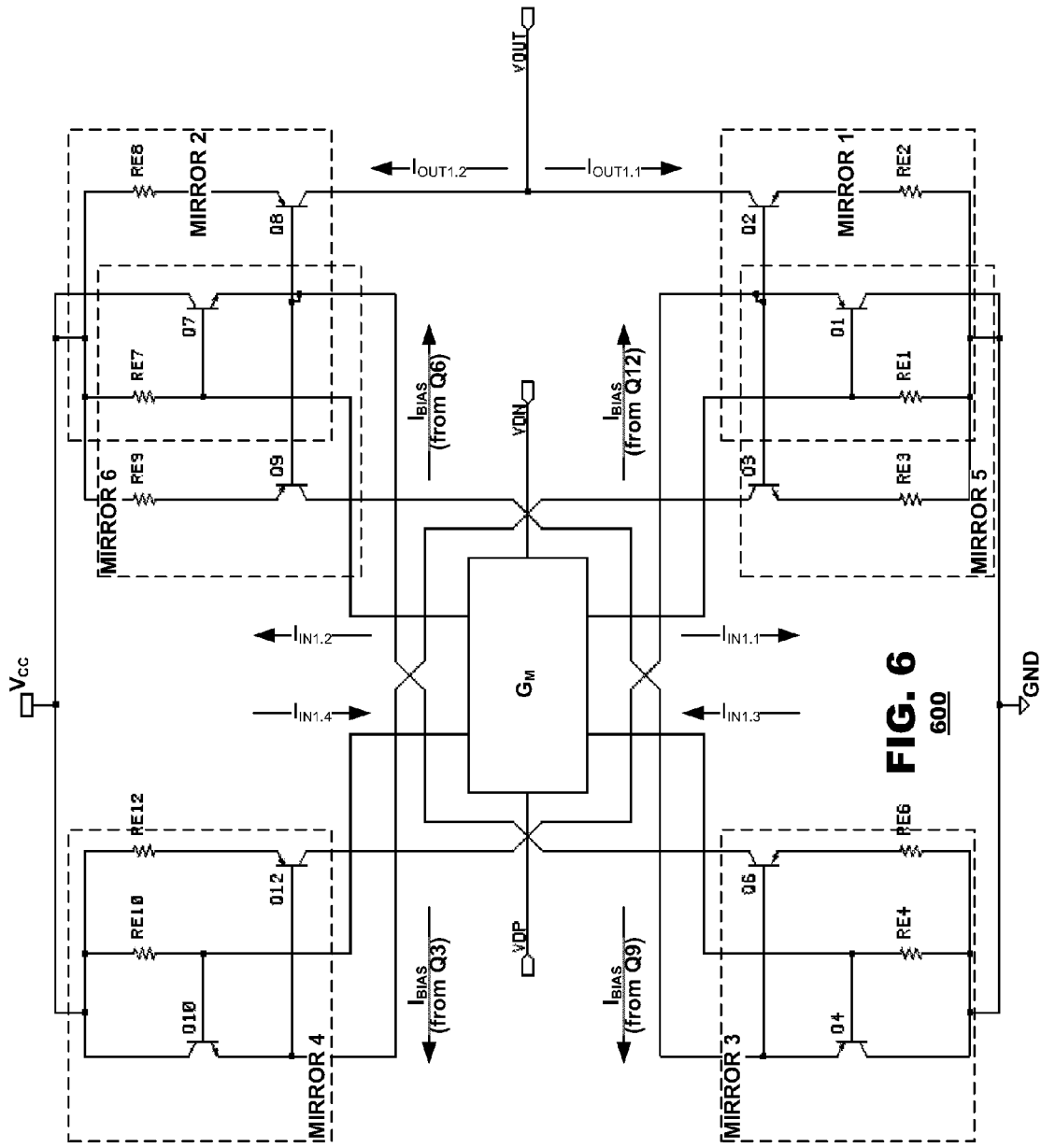
FIG. 6 is a circuit diagram of an operational amplifier according to an embodiment of the present invention.

FIG. 6 illustrates a circuit diagram of the model shown in FIG. 5(*c*) according to an embodiment of the present invention. The circuit 600 of FIG. 6 may include six current mirrors. Mirrors 1, 2 generate the main output currents for the stage. Mirrors 3 and 4 generate bias currents for use by mirrors 1 and 2 (also mirrors 5 and 6). Mirrors 5 and 6 generate bias currents for use by mirrors 3 and 4. FIG. 6 identifies the bias currents input to each mirror and the transistors that generate them.

Figure 7:
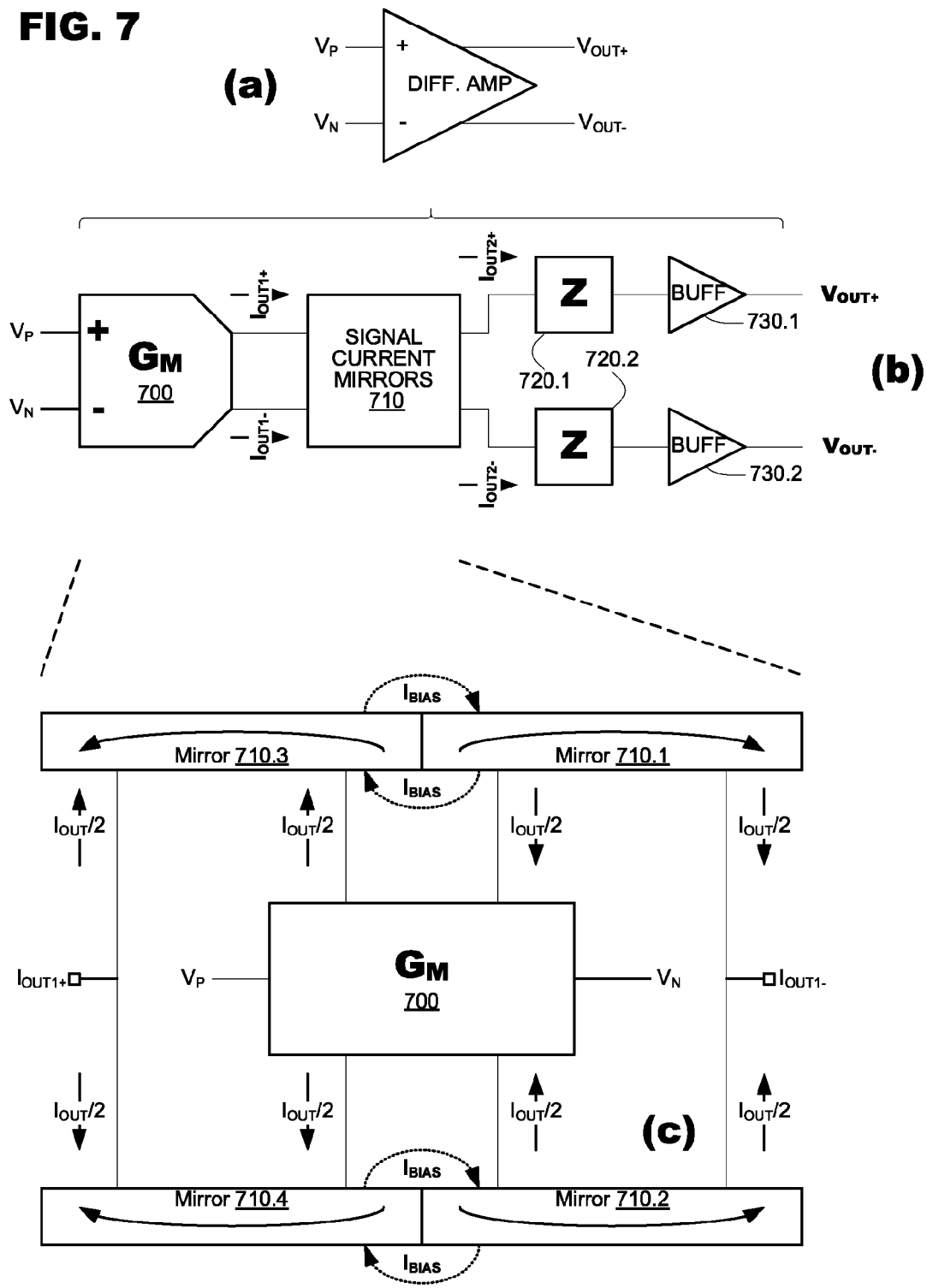
FIG. 7 is a diagram of a differential amplifier according to an embodiment of the present invention.

FIG. 7 illustrates application of the current mirror in a differential amplifier (diff amp), according to an embodiment of the present invention. FIG. 7(*a*) illustrates a differential amplifier symbolically. A differential amplifier is a known circuit that generates a pair of output voltages $V_{OUT+}$, $V_{OUT-}$ based on a difference between two input voltages $V_P$, $V_N$ ($V_{OUT+}-V_{OUT-})=A*(V_P-V_N)$). The value A is a gain factor provided by the amplifier, which is quite large.

FIG. 7(*b*) provides a block diagram for a single stage differential amplifier. In this model, a transconductance cell $G_M$ 700 generates differential output currents $I_{OUT1+}$, $I_{OUT1-}$ in response to a difference between the input voltages ($I_{OUT1+}-I_{OUT1-}=G_M*(V_P-V_N)$). Signal current mirrors 710 may generate output currents $I_{OUT2+}$, $I_{OUT2-}$ corresponding to the currents received from the transconductance cell $G_M$700. The $I_{OUT2+}$, $I_{OUT2-}$ current may pass through impedance blocks 720.1, 720.2 which create corresponding output voltages having magnitude $G_M*Z*(V_P-V_N)$. Another amplifier buffers 730.1, 730.2 may generate output voltages $V_{OUT+}=-V_{OUT-}=G_M*Z*(V_P-V_N)$.

FIG. 7(*c*) illustrates application of the current mirror to a diff amp input stage. A complementary transconductance cell $G_M$700 may generate two pairs of currents each having magnitude $I_{OUT}/2$ in response to a difference among inputs $V_P$ and $V_N$. In the diff amp system, the current mirrors shown in FIG. 3 can be provided as mirrors 710.1-710.4. In response to the respective currents $I_{OUT}/2$, the current mirrors 710.1-710.4 each may generate corresponding currents $I_{OUT}/2$. A first pair of output currents may be summed at an output node to generate a first output current $I_{OUT+}$ and a second pair of output currents, which are oriented opposite to the orientation of the first pair of currents, may be summed to generate the second output current $I_{OUT-}$. The output currents $I_{OUT+}$, $I_{OUT-}$ of FIG. 7(*c*) can be used as currents $I_{OUT2+}$, $I_{OUT2-}$ of FIG. 7(*b*).

Figure 8:
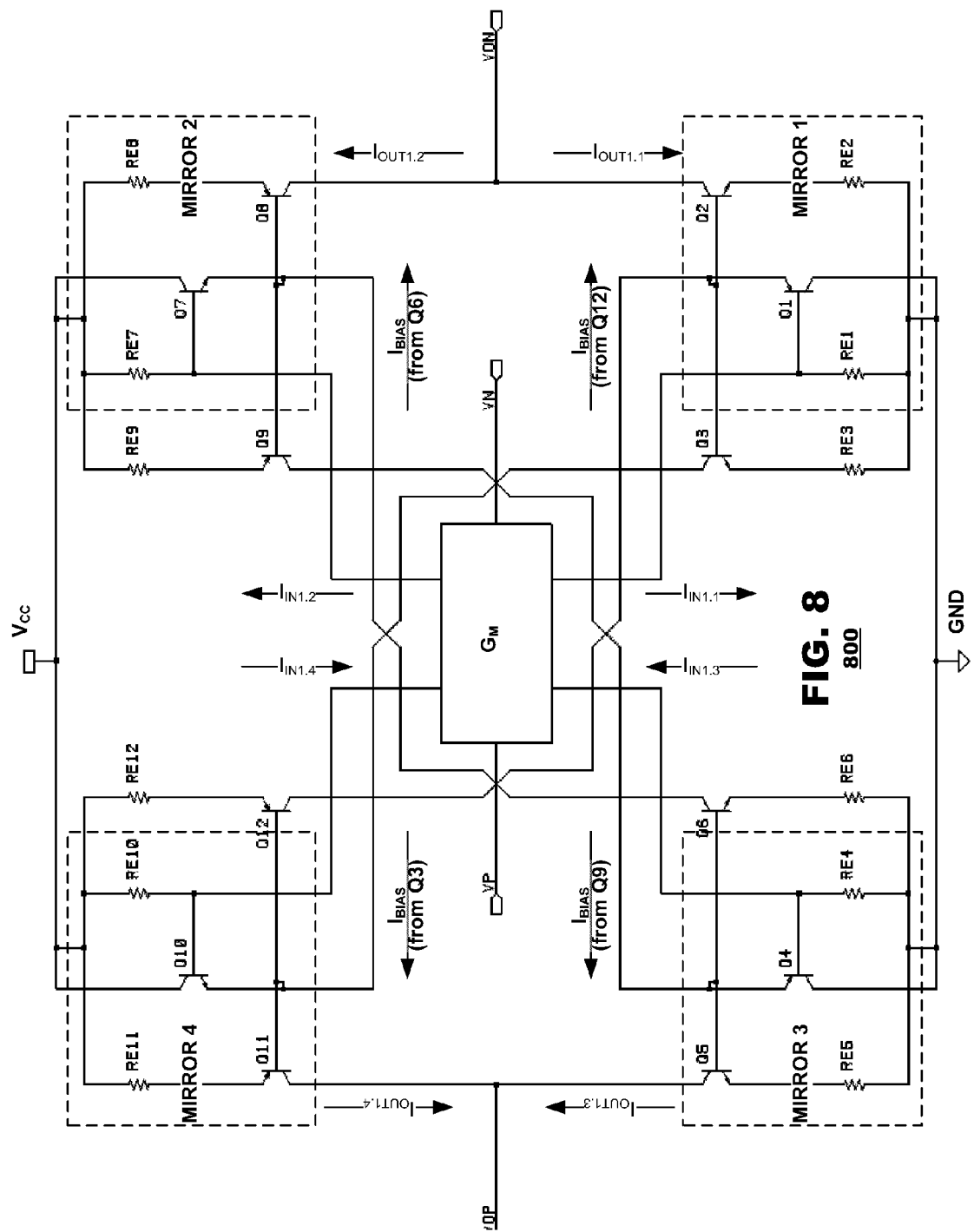
FIG. 8 is a circuit diagram of a differential amplifier according to an embodiment of the present invention.

FIG. 8 illustrates a circuit diagram of the differential amplifier case, in which there are eight current mirrors. Mirrors 1-4 generate the main output currents. Four other mirrors (which are not labeled to retain clarity in the figure) generate bias currents for mirrors 1-4. FIG. 8 identifies the bias currents input to each mirror and the transistors that generates them.

Several embodiments of the present invention are specifically illustrated and described herein. However, it will be appreciated that modifications and variations of the present invention are covered by the above teachings and within the purview of the appended claims without departing from the spirit and intended scope of the invention.

I claim:
1. A current mirror circuit, comprising:
a pair of transistors and a pair of resistors, in which:
a first resistor and a base of a first transistor are coupled to a first input terminal for a first input current,
an emitter of the first transistor and a base of the second transistor are coupled to a second input terminal for a second input current, an emitter of the second transistor being coupled to the second resistor, a collector of the second transistor being coupled to an output terminal of the current mirror, and a collector of the first transistor and the two resistors are coupled to a common node, wherein the second input terminal is coupled to an output terminal of a second current mirror circuit having an identical structure as the current mirror circuit.

2. The current mirror circuit of claim 1, wherein the first and second input currents being replicas of each other.

3. The current mirror circuit of claim 1, wherein an output current generated at the output terminal varies linearly with the first input current.

4. The current mirror circuit of claim 1, wherein a voltage at the first input terminal is characterized by low headroom.

5. The current mirror circuit of claim 2, wherein the second current mirror circuit has an input current that is a complementary current to the first input current.

6. The current mirror circuit of claim 5, wherein the first input current is a sourcing input current and the complementary current is a sinking input current of equal magnitude.

7. The current mirror circuit of claim 5, wherein the first input current is a sinking input current and the complementary current is a sourcing input current of equal magnitude.

8. A method of generating an output current mirroring an input current, comprising:

applying the input current to a first input terminal of a first current mirror circuit, the first input terminal being coupled to a first resistor and a base of a first transistor of the first current mirror circuit, and applying a bias input current to a second input terminal of the first current mirror circuit, the second input terminal being coupled to an emitter of the first transistor and a base of a second transistor of the first current mirror circuit, wherein the first current mirror circuit further comprises an emitter of the second transistor coupled to a second resistor, a collector of the first transistor and the two resistors coupled to a common node, and the output current is provided by an output terminal coupled to a collector of the second transistor, wherein the bias input terminal is coupled to an output terminal of a second current mirror circuit having an identical structure as the first current mirror circuit, and the bias input current is provided by the second current mirror circuit.

9. The method of claim 8, wherein the bias input current is a replica of the input current.

10. The method of claim 8, wherein the output current varies linearly with the input current.

11. The method of claim 8, wherein a voltage at the first input terminal is characterized by low headroom.

12. The method of claim 9, wherein the second current mirror circuit has a second input current that is a complementary current to the input current.

13. The method of claim 12, wherein the input current is a sourcing input current and the complementary current is a sinking input current of equal magnitude.

14. The method of claim 12, wherein the input current is a sinking input current and the complementary current is a sourcing input current of equal magnitude.

15. The current mirror circuit of claim 1, wherein the first and second input currents each have common time-varying characteristics.

* * * * *